United States Patent [19]

Cheong et al.

[11] Patent Number: 5,002,844
[45] Date of Patent: Mar. 26, 1991

[54] PHOTORESIST AND METHOD OF MANUFACTURING THE COLOR CATHODE-RAY TUBE BY USE THEREOF

[75] Inventors: Won-Dae Cheong, Suwon; Sang-Yul You, Seoul; Soo-Min Jeong, Suwon, all of Rep. of Korea

[73] Assignee: Samsung Electron Devices Co., Ltd., Seoul, Rep. of Korea

[21] Appl. No.: 238,401

[22] Filed: Aug. 31, 1988

[30] Foreign Application Priority Data

Aug. 31, 1987 [KR] Rep. of Korea .................. 87-9597
Aug. 31, 1987 [KR] Rep. of Korea .................. 87-9598

[51] Int. Cl.$^5$ .................. G03F 7/04; G03F 7/26; G03C 1/66; G03C 5/22
[52] U.S. Cl. .................. 430/28; 430/23; 430/29; 430/274; 430/289; 430/26
[58] Field of Search .................. 430/23, 28, 29, 274, 430/289, 26

[56] References Cited

U.S. PATENT DOCUMENTS

| | | | |
|---|---|---|---|
| 2,992,107 | 7/1961 | Kaplan et al. | 430/274 |
| 3,140,176 | 7/1964 | Hoffman | 430/28 |
| 3,269,838 | 8/1966 | Saulnier | 430/28 |
| 3,317,319 | 5/1967 | Mayaud | 430/28 |
| 3,342,594 | 9/1967 | Kaplan | 430/28 |
| 3,406,068 | 10/1968 | Law | 430/23 |
| 3,589,907 | 6/1971 | Dijkstra | 430/28 |
| 4,028,114 | 6/1977 | Viohl | 430/274 |
| 4,049,452 | 9/1977 | Nekut | 430/28 |
| 4,254,197 | 3/1981 | Miura et al. | 430/28 |
| 4,556,626 | 12/1985 | Speigel | 430/28 |

Primary Examiner—Charles L. Bowers, Jr.

[57] ABSTRACT

Photoresist for forming the phosphor screen of color cathode-ray tube made up of the composition rate of pure water 10-50%, polyvinyl alcohol 5-30%, dichromate potassium salt 0.5-5%, diethylene glycol 0.5-10%, ethylene glycol 0.5-5%, urea 0.5-10%, acetamide 0.5-5%, butanediol 0.5-10%, paraaldehyde 0.5-5%, dioxane 0.5-5%, a surfactant 0.5-5%.

5 Claims, 1 Drawing Sheet

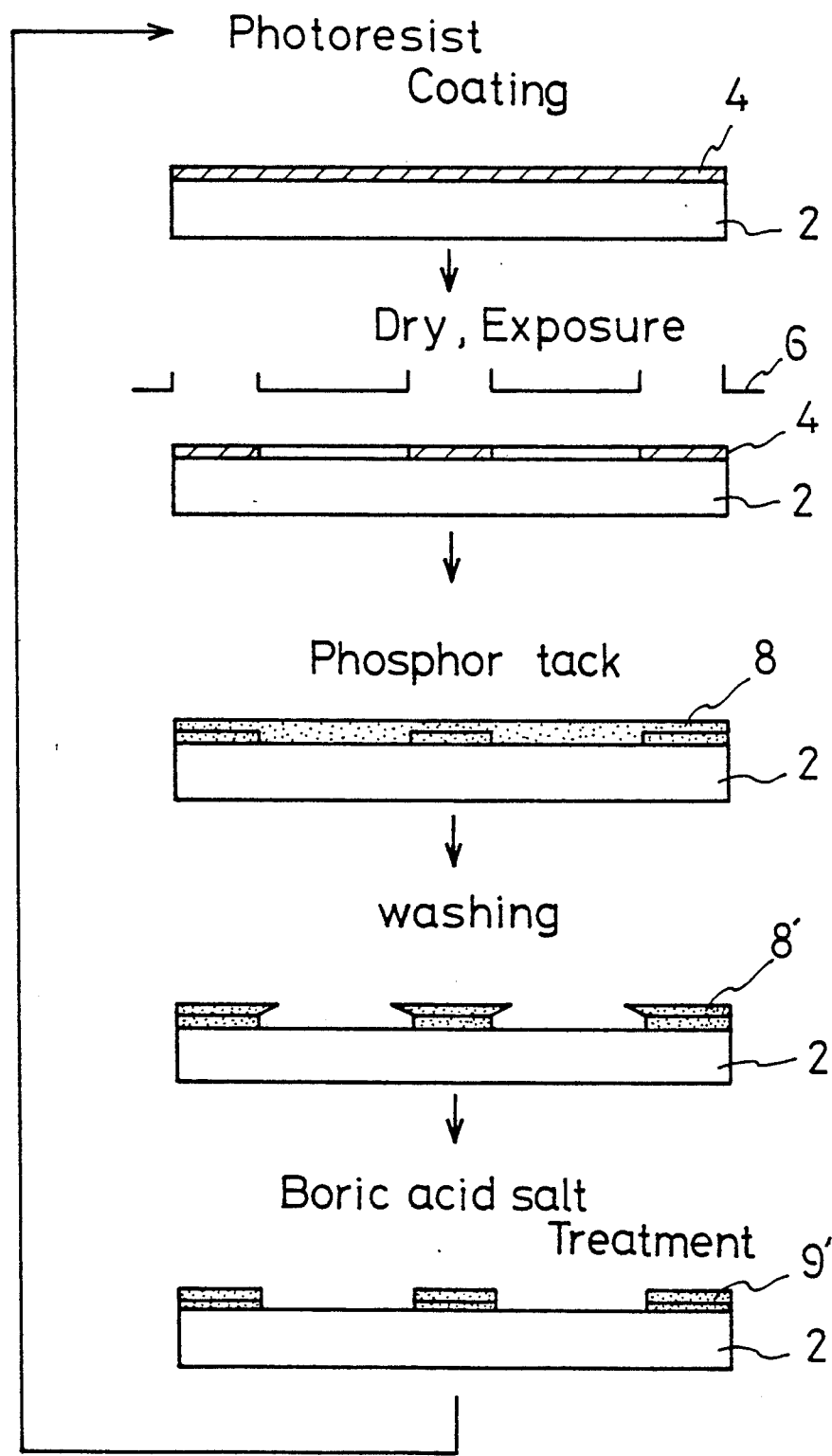

PHOTORESIST AND METHOD OF MANUFACTURING THE COLOR CATHODE-RAY TUBE BY USE THEREOF

FIELD OF THE INVENTION

The present invention relates to photoresist for forming the phosphor screen of the color cathode-ray tube and the method of manufacturing the phosphor screen by use thereof.

BACKGROUND OF THE INVENTION

In the inner side at the face plate of the color cathode-ray tube, three color phosphor patterns are arranged and so form the phosphor screen.

As the method these phosphors are spread to form a designated pattern in the inner side of the face plate, it is done slurry spread method by using photoresist blended with the phosphor and dry method by sensitizer with diazonium salt, diazonium salt is resolved to be exposed to mercury excited ultraviolet and then have adhesion in that $ZnCl_2$ absorbs the moisture in the air.

The method of manufacturing the sensitizer by using these methods is disclosed Korean Patent 83-3421, filed July 25, 1983 and Korean Patent Application No. 83-3645, filed Aug. 4, 1983, etc.

As the former slurry spread method develops by washing unexposed part after spreading the phosphor slurry to the inner side of the face plate and exposing the only designated part through the shadow mask, there is an disadvantage that the exposure time is long because the photosensitivity is low and that it is unable to obtain the minute and phosphor pattern because exposed ultraviolet causes light scattering on the surface of the phosphor.

As the latter dry method is to spread the sensitizer in the inner side of the face plate and dry, then adhere by exposing and scattering the phosphor, where in wash phosphor remaining in unexposing area by blowing air and to form by destroying the tack which reveal the exposed sensitizer through dose of roading materials, it is able to obtain the good phosphor pattern than the predescribed slurry spread method, but it is difficult to remove the phosphor remaining to unexposed area clearly on account of removing by blowing air, there occurs color-remaining at the next time to spread the fluorescent film.

The clearness of the picture at the color cathode-ray tube is influenced by how fine, straight, right trio color phosphor patterns of red, blue, green can be formed.

SUMMARY OF THE INVENTION

The object of the present invention is to provide photoresist that is no variation of the tack after exposure and dry, dry temperature range to be wide.

The other object of the present invention is to provide method of forming the phosphor screen obtainable systematic and clear high-fine phosphor screen by using predescribed photoresist.

According to this, the photoresist of the present invention is made up at a rate pure water 10–50%, polyvinyl alcohol 5–30%, dichromate salt 0.5–5%, diethylene glycol 0.5–5%, ethylene glycol 0.5–5%, urea 0.5–5%, acetamide 0.5–5%. Butanediol 0.5–10%. paraaldehyde 0.5–5%, dioxane 0.5–5%, a sulfactant 0.5–5%.

And the method of forming phosphor by using predescribed composition is followed to spread predescribed composition in the inner side of the face plate of the color cathode-ray tube and expose, dry, then adhere to exposed area by light scattering the phosphor, after removal of the phosphor of unexposed area by water, process flow of contraction, adherence the phosphor screen by managing with boric acid.

BRIEF DESCRIPTION OF THE DRAWING

FIG. 1 is the process chart shows the method of the present invention.

FIG. 2 is the picture that shows the stripe form of the fluorescent film obtained by the method of the present invention.

FIG. 3 is the picture that shows the stripe form of the fluorescent film obtained by the old slurry spread method.

The present invention may be understood more minute as under practical example.

DETAILED DESCRIPTION OF THE INVENTION

The photoresist of the present invention consists of the following material.

Polyvinyl alcohol: 5–30% is added. This has the specific character photo-bridging by $Cr^{+++}$ reduced to receive the light of the wavelength 364 nm. That is to say, the carboxyl radical which is resolved product found finally during oxidation-reduction reaction forms $Cl^{+++}$ and composition of octahedron.

This carboxyl radical has the covalent bond as the ionized radical congelated with $\alpha$, $\beta$ on the structure. This point of the covalent bond is saturated by ionized radical of other polyvinyl alcohol chain and is formed 3-dimensional light bridging, then reduces fairly the solubility to water.

Dichromate salt; 0.5–5% is added. It maintains the sensitivity to light stable from heat or the other outer effect by reaction with polyvinyl alcohol.

At the present invention, the best result is obtained to use dichromatic potassium salt as dichromate salt.

Diethylene glycol; 0.5–5% is added, a plasticizer is added. Ethylene glycol; 0.5–5% is added, sensitivity to light and condition of drying are determined.

Urea and acetamide; 0.5–5is added. These materials that contain amine keep them dry at the moment of forming the fluorescent layer and have crystallization of the phosphor good by absorbing the moisture in the air. First class reagent of Hayashi, Japan was used in the present experiment.

Butandiol; 0.5–10% is added. This operates as plasticizer obtained to whole composition.

Paraaldehyde and dioxane; They control the speed of evaporation of the composition operated as plasticizer and keep the condition of dry of resin film sensitive to light uniformly.

Surfactant: It is obtained by resolving Tamol 731SD sodium salt of polymeric carboxylic acid which can be obtained from American Rohm & Haas Co. with hot water 100 ml and dosing triton CF-104-5 drops.

The composition of predescribed materials is made up as follows.

First, stirred the diluted polyvinyl alcohol solution with pure water continuously at room temperatures, pour diethylene glycol and ethyleneglycol.

After stirring for 10 minutes and mixing cell, add area, acetamide, butanediol in turns.

On stirring continuously, mix paraaldehyde and dioxane and then dose a surfactant.

The composition obtained is filtered by 400 mesh and used. The tack of the composition and the adjustment of the solid body are controlled by the adjustment of polyvinyl, pure water in accordance with distribution density of the fluorescent film.

The whole content of plasticizer is limited to 20–50%.

In the content of plasticizer is under 20 w/v %, the phosphor becomes dry easily and the sticking density of the fluorescent film decreases, in case of exceeding 50 w/v % pattern does not form on account of non dry.

Also, predescribed composition is used as the spread of red, blue fluorescent film as it is, in case of green fluorescent layer it is used to add cohesion to increase the adhesion with the glass surface. It is used American Dupon Co. Ludox AM at a range 0.5–5% as a cohesion.

The method of forming phosphor screen with predescribed composition is dome as the drawing of FIG. 1.

We spread predescribed composition at the inner side of the face plate (2) and form first sensitivity to light(4).

Then fix the green fluorescent layer mask(6) to the face plate(2) and expose. The exposed part at the first sensitivity to light(4) has the tack and insolubility to water, then it we eject phosphor powder, green fluorescent film is formed.

The content of plasticizer of predescribed composition is 20–50 w/v %, so the adhesion density of the phosphor become very high. And if we collect exceeding scattered phosphor with a suitable capturing means like a vacuum inhaler, it is able to collect excess phosphor and protect the contamination of the phosphor. If we wash this with pure water and wash the phosphor of the unexposed part and remaining phosphor perfectly, green fluorescent layer pattern(8') remains. If we wash this with boric acid water, the fluorescent film pattern is contracted and adhered, it is obtainable an ordered and clear green fluorescent film pattern. Boric acid water was used 2.5%. solution.

Red, blue fluorescent film pattern is used predescribed composition as it is and is obtained by the same method with green fluorescent layer pattern.

The enlarged photograph of the fluorescent film pattern obtained by this way is FIG. 2. The magnification of fluorescent film pattern obtained by the former slurry spread method is shown in the photograph of FIG. 3. The fluorescent film pattern of the present invention displays more orderly and clear with the naked eye.

What is claimed:

1. Photoresist for forming the phosphor screen of color cathode-ray tube made up of the composition rate of pure water 10–50%, polyvinyl alcohol 5–30%, dichromatic potassium salt 0.5–5%, diethylene glycol 0.5–10%, ethylene glycol 0.5–5%, urea 0.5–10% acetamide 0.5–5%, butanediol 0.5–10%, paraaldehyde 0.5–5%, dioxane 0.5–5%, a surfactant 0.5–5%.

2. Photoresist for forming the phosphor screen of color cathode ray tube characterized in that the total sum of diethylene glycol, ethylene glycol, butanediol, paraaldehyde and dioxane ranges 20–50 w/v % according to the claim 1.

3. The method of forming the fluorescent film comprising the following process that according to forming the red, blue, green fluorescent film pattern of color cathode ray tube, spread photoresist at the inner side of the face of color cathode-ray tube composed by pure water 10–14%, polyvinyl alcohol 5–30%, dichromate potassium salt 0.5–5%, diethylene glycol 0.5–10%, ethylene glycol 0.5–5%, urea 0.5–10%, acetamide 0.5–5%, butanediol 0.5–10%, paraaldehyde 0.5 –5%, dioxane 0.5–5%, surfactant 0.5–5%, dry, then have the designated part exposed by irradiation ultraviolet through fluorescent film mask, so maintain the tack, hereto scatter and adhere phosphor powder, after removing phosphor powder ejected exceedingly, wash unexposed phosphor remained at the panel, contract and adhere the fluorescent film pattern with boric acid by forming the designated fluorescent film pattern.

4. The method of forming fluorescent film characterized in that boric acid is used 2.5–10% solution according to the claim 3.

5. The method of forming fluorescent film characterized in that collecting phosphor by vacuum inhalation phosphor powder scattered exceedingly according to the claim 3.

* * * * *